US006784674B2

(12) United States Patent
Miller

(10) Patent No.: US 6,784,674 B2
(45) Date of Patent: Aug. 31, 2004

(54) TEST SIGNAL DISTRIBUTION SYSTEM FOR IC TESTER

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/142,549

(22) Filed: May 8, 2002

(65) Prior Publication Data

US 2003/0210067 A1 Nov. 13, 2003

(51) Int. Cl.[7] .............................................. G01R 31/02
(52) U.S. Cl. ...................................... 324/754; 324/760
(58) Field of Search ........................ 324/754, 757–758, 324/760, 762, 765; 714/724, 734, 738, 742; 333/33, 246–247

(56) References Cited

U.S. PATENT DOCUMENTS

| | | | | |
|---|---|---|---|---|
| 4,616,178 A | * | 10/1986 | Thornton, Jr. et al. | 324/754 |
| 5,546,405 A | * | 8/1996 | Golla | 324/754 |
| 5,974,662 A | * | 11/1999 | Eldridge et al. | 29/842 |
| 6,064,213 A | * | 5/2000 | Khandros et al. | 324/754 |
| 6,154,715 A | * | 11/2000 | Dinteman et al. | 714/738 |
| 6,175,939 B1 | * | 1/2001 | Dinteman | 714/724 |
| 6,218,910 B1 | * | 4/2001 | Miller | 324/765 |
| 6,255,126 B1 | * | 7/2001 | Mathieu et al. | 438/15 |
| 6,336,269 B1 | * | 1/2002 | Eldridge et al. | 29/885 |
| 6,377,062 B1 | * | 4/2002 | Ramos et al. | 324/754 |
| 6,501,343 B2 | * | 12/2002 | Miller | 324/765 |
| 2001/0012739 A1 | * | 8/2001 | Grube et al. | 439/862 |
| 2002/0049554 A1 | * | 4/2002 | Miller | 702/104 |
| 2002/0132501 A1 | * | 9/2002 | Eldridge et al. | 439/66 |

\* cited by examiner

*Primary Examiner*—David A. Zarneke
*Assistant Examiner*—Jermele M. Hollington
(74) *Attorney, Agent, or Firm*—Smith-Hill and Bedell

(57) ABSTRACT

A probe board provides signal paths between an integrated circuit (IC) tester and probes accessing terminals on the surfaces of ICs formed on a semiconductor wafer for receiving test signals form the IC tester. A branching signal path within the probe board distributes a test signal produced by one channel of the IC tester to several probes. Resistors within the branching signal path resistively isolate the probes from one another so that a fault occurring at any one IC terminal will not affect the logic state of the test signal arriving at any other IC terminal. The isolation resistors are sized relative to signal path characteristic impedances so as to substantially minimize test signal reflections at the branch points.

32 Claims, 6 Drawing Sheets

TEST SIGNAL DISTRIBUTION SYSTEM FOR IC TESTER

FIELD OF THE INVENTION

The invention relates in general to interconnect systems for providing signal paths between an integrated circuit (IC) tester and pads on the surfaces of ICs, and in particular to a system for distributing a single test signal output of an IC tester to multiple pads on one or more ICs.

DESCRIPTION OF RELATED ART

An integrated circuit (IC) manufacturer fabricates an array of similar integrated circuits on a semiconductor wafer and then cuts the wafer to separate the ICs from one another. The ICs include pads on their upper surfaces providing points of contact for signal paths conveying IC output signals to other circuits or for receiving IC input signals from other circuits. The manufacturer may mount an IC in a package using bond wires to link the pads on the surface of the IC to package pins providing signal paths to external circuits. An IC can also be mounted directly on a printed circuit board (PCB) either by soldering pads on its surface to correspondingly arranged contact pads on the surfaces of the PCB or by providing spring contacts between pads on the surface of the ICs and the PCB's contact pads. The spring contacts may be attached to the IC's input/output (I/O) pads on the IC with their tips contacting the PCB's pads, may be attached to the PCB's pads with their tips contacting the IC's I/O pads, or may be attached to both the IC and PCB pads.

ICs are often tested at the wafer level before they are separated from one another. For example, as illustrated in FIG. 1, an IC tester 10 for testing ICs 12 residing on a wafer 14 includes a set of tester channels, each of which may either transmit a test signal to an IC I/O pad or monitor an IC output signal appearing at an IC I/O pad to determine whether the IC responds correctly to its input signals. A bundle of coaxial cables 18 provides separate signal paths between the input/output terminal of each tester channel and a cable connector 16 on a probe board assembly 20. A set of probes 22 connects pads on the lower surface of probe board assembly 20 to the pads on the upper surfaces of ICs 12. While coaxial or other kinds of cables 18 have been used to link a tester 10 to a probe board assembly 20 as illustrated in FIG. 1, pogo pin connectors have also often been used to provide signals paths between an IC tester and a probe board assembly.

Various types of structures can be used to implement probes 22 including, for example, wire bond and lithographic spring contacts, needle probes, and cobra probes. When spring contacts are employed to implement probes 22, they can be formed on the I/O pads of ICs 12 when probe board assembly 20 includes pads on its lower surface arranged to contact the tips of the spring contacts. U.S. Pat. No. 6,064,213, issued May 16, 2000 to Khandros et al (incorporated herein by reference), exemplifies such a probe board assembly.

When spring contacts are not formed on the I/O pads of ICs 12, they can be formed on the lower surface of probe board assembly 20 and arranged so that their tips contact the I/O pads of ICs 12. U.S. Pat. No. 5,974,662 issued Nov. 2, 1999 to Eldridge et al (incorporated herein by reference) describes an example of a probe board assembly employing spring contact probes. The following documents (also incorporated herein by reference) disclose various exemplary methods for manufacturing spring contacts: U.S. Pat. No. 6,336,269 issued Jan. 8, 2002, to Eldridge et al., U.S. Pat. No. 6,255,126 issued Jul. 31, 2001 to Mathieu et al., U.S. patent application Ser. No. 09/710,539 filed Nov. 9, 2000, and U.S. patent application Ser. No. 09/746,716 filed Dec. 22, 2000.

Probe board assembly 20 provides signal paths between cable connectors 16 and the pads on the lower surface of probe board assembly 20 that probes 22 contact. Some probe board assemblies 20 are formed by multiple-layer printed circuit board having traces formed on the various layers for conveying signals horizontally and vias for conveying signals vertically though the layers. Other probe board assemblies include several separate substrate layers interconnected through spring contacts. See for example, U.S. Pat. No. 5,974,662 issued Nov. 2, 1992 to Eldridge, et al, incorporated herein by reference.

To test all ICs 12 on wafer 14, the channels within tester 10 must be able to access all I/O pads of all ICs. For example, ICs 12 might be random access memories (RAMs), with each RAM having eight I/O pads acting as an 8-bit address input, another eight I/O pads acting as an 8-bit data input/output, and one or more additional I/O pads for receiving input control signals. To test such a RAM IC, tester 10 writes data to each of its addresses, reads the data back out of each address and determines whether the data read out of the RAM matches the data written into it.

Thus tester 10 might include seventeen or more channels for each RAM IC to be tested, including eight channels for supplying signals conveying the 8-bit address, eight bi-directional channels for transmitting and receiving the 8-bit data, and one or more additional channels for providing the RAM's control signal inputs. However since a wafer 14 typically includes a large number of ICs 12, tester 10 would require a very large number of channels to concurrently test all of the ICs. Thus wafer-level IC testers typically test only a portion of the ICs of a wafer at a time, with the wafer being repositioned under the probes after each group of ICs is tested so that a next group of ICs can be tested.

What is needed is an inexpensive interconnect system that can distribute a test signal from an IC tester to pads of several ICs at the same time without causing substantial distortion due to signal reflection, and without requiring transmission lines having more than one characteristic impedance.

BRIEF SUMMARY OF THE INVENTION

The invention relates to an interconnect system for providing signal paths between an integrated circuit (IC) tester and input/output (I/O) pads of ICs formed on a semiconductor wafer so that the IC tester can test the ICs. The interconnect system includes a set of probes for accessing the I/O pads and a probe board assembly providing signal paths for conducting signals between the IC tester and the probes.

In accordance with an embodiment of the invention, a branching signal path within the probe board distributes a test signal produced by one channel of the IC tester to several probes. Isolation resistors within the branching signal path resistively isolate the probes from one another with sufficient resistance that a fault at any IC terminal connecting that IC terminal to a potential source through a low impedance path will not affect the logic state of the test signal arriving at any other IC terminal.

The isolation resistors are also sized relative to characteristic impedances of signal paths in which they reside so as to substantially minimize test signal reflections at the branch points. For example a set of four 200 Ohm isolation resistors are provided at a branch node between a 50 Ohm incoming transmission line and a set of four outgoing transmission lines since the parallel combination of four 200 Ohm resistors provides an equivalent 50 Ohm impedance matching the impedance of the incoming transmission line.

An impedance mismatch can occur between each isolation resistor and the outgoing signal path to which it is linked, as for example when each 200 Ohm isolation resistor is connected to a 50 Ohm outgoing transmission line. Such an impedance mismatch causes the junction between each isolation resistor and an outgoing transmission line to reflect a portion of the test signal as it travels toward a probe. However the isolation resistors are sufficiently large to attenuate such reflections so that they do not substantially distort the test signal upstream of the isolation resistors. Thus a reflection of a test signal in any one branch of the path adds little distortion to the test signal passing into any other branch of that path.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

Figure 3A:
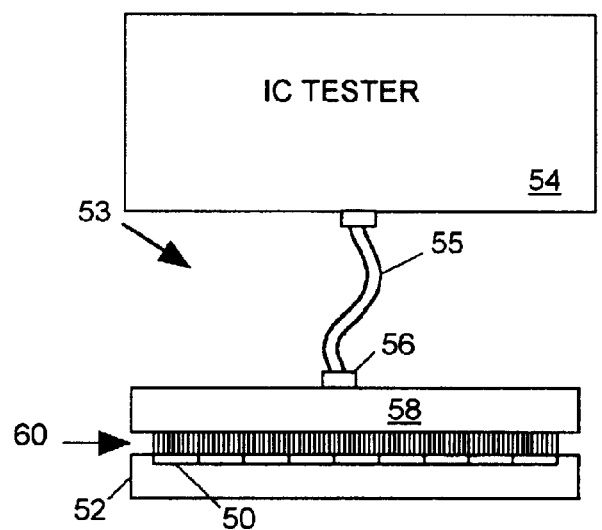
FIGS. 3A and 3B are a simplified side elevation views of a probe board assembly in accordance alternative embodiments of the invention for providing an integrated circuit (IC) tester with access to input/output pads of a set of ICs formed on a semiconductor wafer.
Figure 3B:
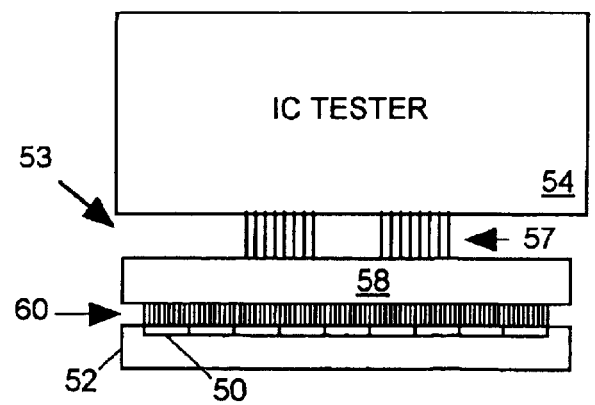
Figure 9:
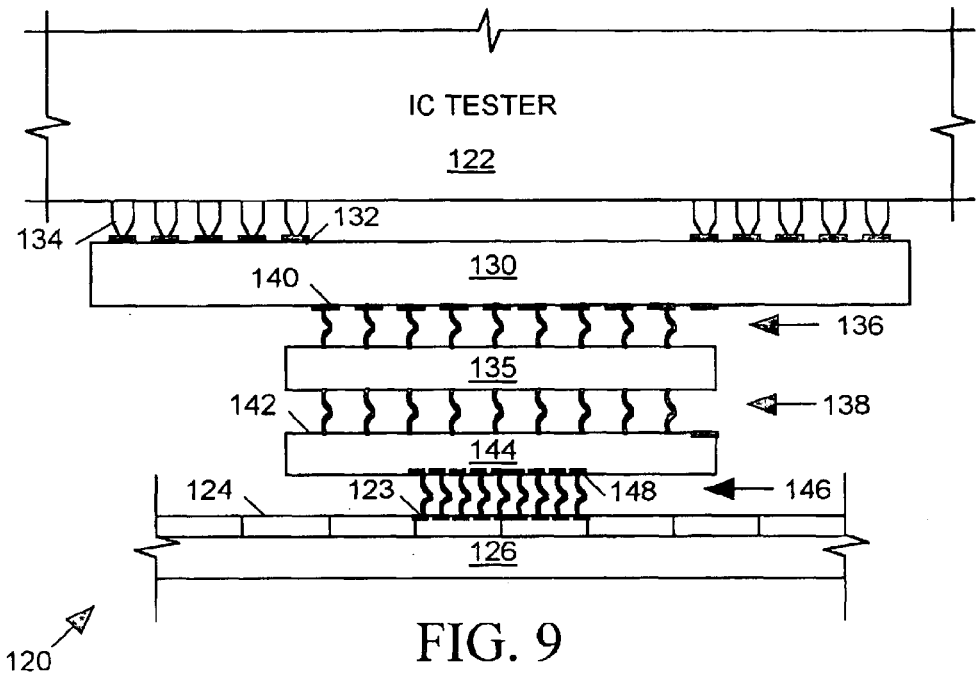

FIG. 9 is a simplified side elevation view of a probe board assembly in accordance and alternative embodiment of the invention for providing an integrated circuit (IC) tester with access to input/output pads of a set of ICs formed on a semiconductor wafer; and FIGS. 10–13 are schematic diagrams alternative embodiments of a signal path in accordance with the invention between a channel of the tester of FIG. 3A or 3B and pads on the wafer of FIG. 9.

DETAILED DESCRIPTION OF EXEMPLARY EMBODIMENTS OF THE INVENTION

The present invention relates to an interconnect system for routing a test signal from a driver in one channel of an integrated circuit (IC) tester to more than one IC input/output (I/O) pad. The specification below describes one or more exemplary embodiments and/or applications of the invention considered by the applicant(s) to be the best modes of practicing the invention.

Figure 1:
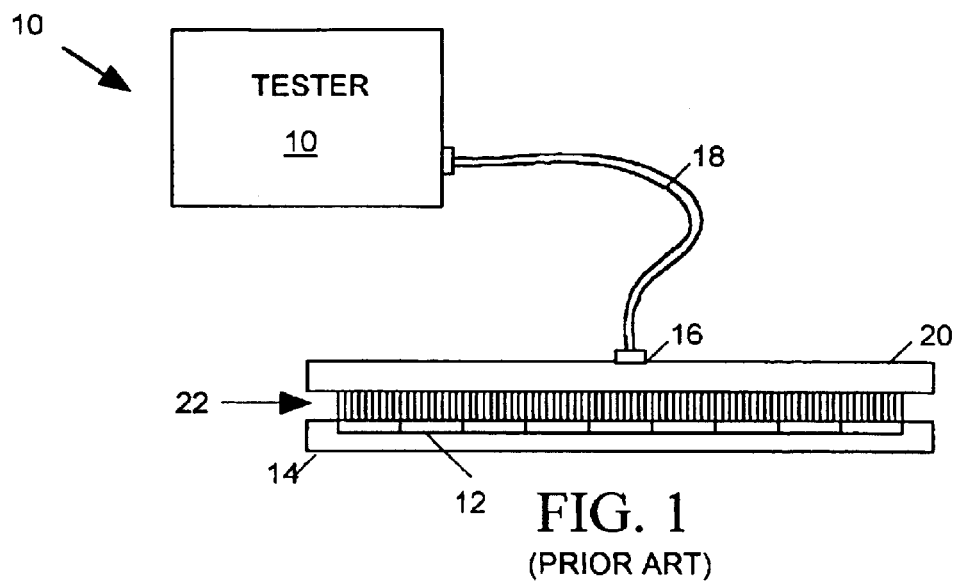
FIG. 1 is a simplified side elevation view of a prior art probe board assembly providing an integrated circuit (IC) tester with access to input/output pads of a set of ICs formed on a semiconductor wafer.
Figure 2:
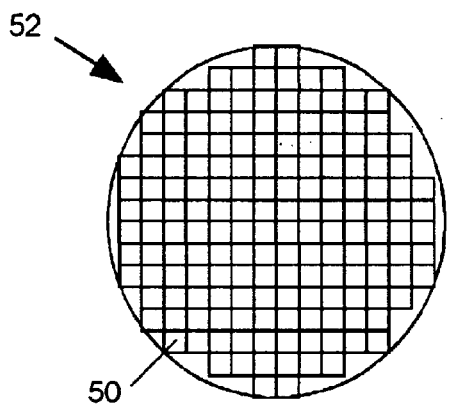
FIG. 2 is a simplified plan view of a prior art semiconductor wafer containing an array of ICs.

As illustrated in FIG. 2, an integrated circuit (IC) manufacturer initially forms an array of ICs 50 on a semiconductor wafer 52. The wafer is thereafter cut to separate the ICs so that they can be separately packaged or mounted on printed circuit boards. However it is advantageous to test the ICs before they are separated from one another.

FIGS. 3A and 3B are simplified side elevation views of alternative embodiments of an interconnect system 53 in accordance with the invention for providing signal paths between an integrated circuit tester 54 and the I/O pads of a set of ICs 50 formed on semiconductor wafer 52 of FIG. 2. A set of tester channels within tester 54 transmit test signals through interconnect system 53 to I/O pads of ICs 50. Interconnect system 53 also returns output signals ICs 50 produce at their I/O pads in response to the test signals to tester 10 and tester 10 monitors those output signals to determine whether the ICs are behaving as expected.

Interconnect system 53 includes a probe board assembly 58 providing a large number of signal paths between its upper and lower surfaces. A variety of structures may be used to provide signal paths between tester 54 and the upper surface of the probe board assembly 58. For example, as illustrated in FIG. 3A, interconnect system 53 includes a set of coaxial cables 55 providing signal paths between tester 54 and a connector 56 on the upper surface of probe board assembly 58. Alternatively, as illustrated in FIG. 3B, interconnect system 53 may employ a set of pogo pins 57 to provide signal paths between tester 54 and pads on the upper surface of probe board assembly 58. The coaxial cables 55 and pogo pins 57 are exemplary; those of skill in the art wall appreciate that other types of conductors can be used to provide signal paths between tester 54 and probe board assembly 58.

A set of probes 60 link pads on the lower surface of probe board assembly 58 to the I/O pads on the surfaces of ICs 50. Various kinds of probes known to those of skill in the art may implement probes 60 including, but not limited to, wire bond and lithographic spring contacts, needle probes, and cobra probes. When spring contacts are employed to implement probes 60, they can be formed on the I/O pads of ICs 50 when probe board assembly 58 includes pads on its lower surface arranged to contact the tips of the spring contacts. U.S. Pat. No. 5,974,662 issued May 16, 2000 to Khandros et al (incorporated herein by reference) exemplifies such a probe board assembly.) When spring contacts are not formed on the I/O pads of ICs 50, they can be formed on the lower surface of probe board assembly 58 and arranged so that their tips contact the I/O pads of ICs 50.

U.S. Pat. No. 5,974,662 issued Nov. 2, 1999 to Eldridge et al. (incorporated herein by reference) describes an example of a probe board assembly employing spring contact probes. U.S. patent application Ser. No. 09/810,871 filed Mar. 16, 2001 (incorporated herein by reference) also describes an example of a probe board assembly employing spring contact probes. The following documents (incorporated herein by reference) disclose various exemplary methods for manufacturing spring contacts: U.S. Pat. No. 6,336,269 issued Jan. 8, 2002 to Eldridge et al., U.S. Pat. No. 6,255,126 issued Jul. 31, 2001 to Mathieu et al., U.S. patent application Ser. No. 09/710,539 filed Nov. 9, 2000, and U.S. patent application Ser. No. 09/746,716 filed Dec. 22, 2000.

Probe board assembly 58 may, for example, be implemented by a single substrate having one or more layers with microstrip or stripline traces formed on or between the layers acting as transmission lines for conveying signals horizontally and vias for conveying the signal vertically through the layers. Alternatively substrate layers of the probe board assembly 58 may be vertically spaced from one another with spring contacts or other interconnect structures providing signal paths between the separate layers boards as illustrated, for example, in U.S. Pat. No. 5,974,662 issued to Eldridge, et al. Nov. 2, 1999 (incorporated herein by reference).

When one of the ICs 50 under test produces an output signal at one of the I/O pads on its upper surface, the output signal passes through one of probes 60 to a pad on the lower surface of probe board assembly 58 and then passes through a path provided by the probe board assembly and through cables 55 or pogo pins 57 to a receiver within a channel of tester 54. Conversely when a driver within tester 54 sends a test signal outward via one of cables 55 or pogo points 57 to probe board assembly 58, the test signal travels through a path provided by the probe board assembly 58 to one (or more) of probes 60. The probe or probe(s) 60 then conveys the test signal to one or more I/O pads on the surface of one or more of ICs 50.

To fully test every IC 50 on wafer 52, tester 54 must be able to access every I/O pad of every IC. Since wafer 52 may include a large number of ICs 50, and since each IC 50 may have a large number of I/O pads, tester 54 requires a large number of channels in order to concurrently test all ICs 50 on waver 52. To reduce the number of channels needed to test ICs 50, a probe board assembly 58 distributes the test signal output of any one tester channel to corresponding I/O pads of more than one IC 50, to multiple I/O pads on a single IC, or to a combination of the foregoing. The invention relates in particular to the nature of the signal path probe board assembly 58 provides for distributing a single test signal to several probes 60.

In accordance with the invention, the number of tester channels needed is reduced by employing one channel of tester 54 to drive corresponding inputs of several ICs. For example, when the ICs to be tested are RAMs, each having an 8-bit input address, a set of eight tester channels supplies the same 8-bit input address concurrently to several RAM ICs. Similarly a control signal generated by a single tester channel can be distributed to control inputs of several RAM ICs.

Figure 4:
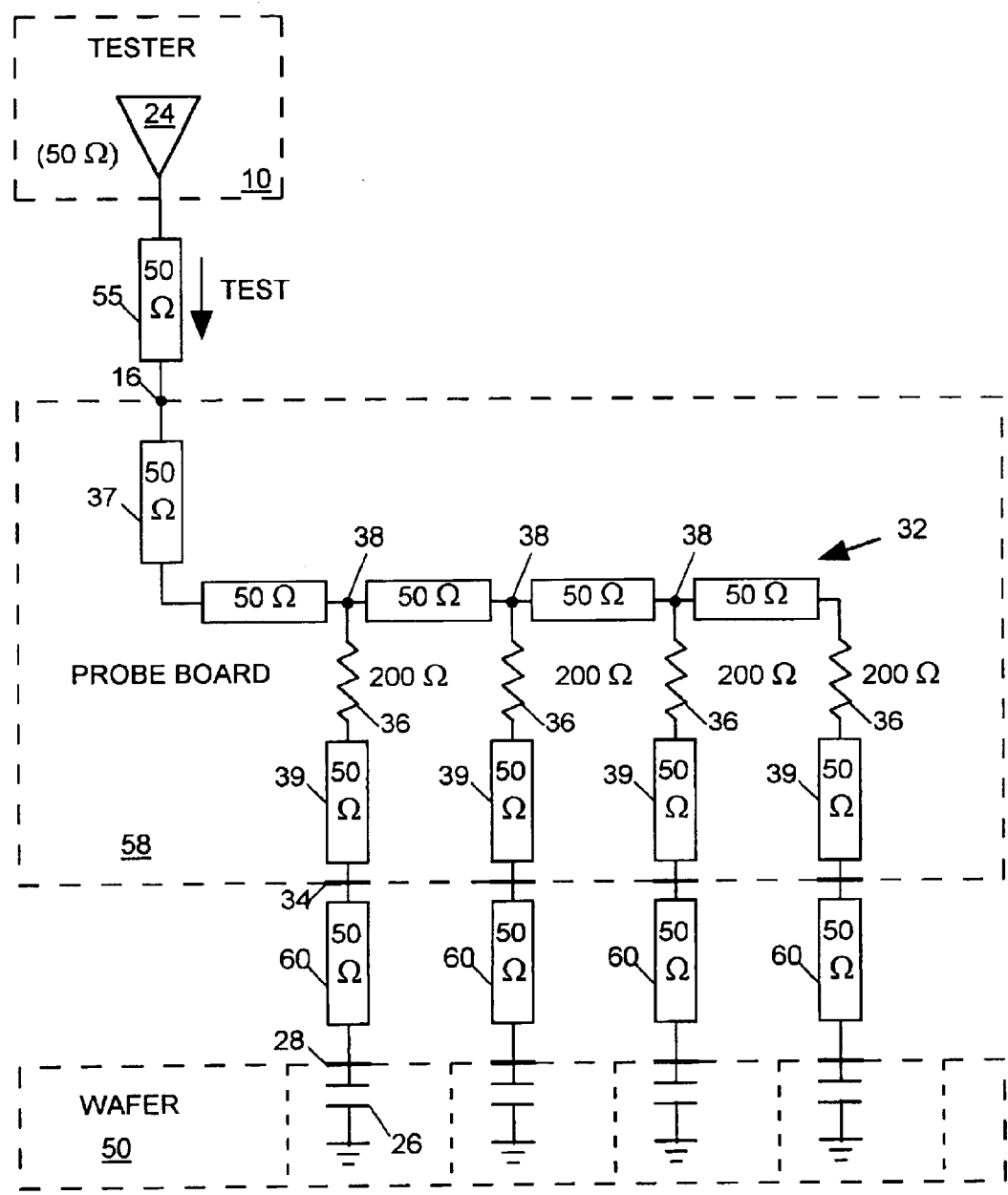
FIGS. 4–8 are schematic diagrams alternative embodiments of a signal path in accordance with the invention between a channel of the tester of FIG. 3A or 3B and pads on the wafer of FIG. 3A or 3B.

FIG. 4 is a schematic representation of a network implemented within probe board assembly 58 of FIG. 3A or 3B, for distributing a test signal generated by a driver 24 of a single tester channel within tester 54 to corresponding I/O pads 28 of four separate ICs 50. Since the input impedance of each I/O pad 28 is primarily capacitive (typically about 2 picofarads), the input impedance of each pad 28 is modeled in FIG. 4 by a 2 picofarad capacitor 26. One of the coaxial cables 55 of FIG. 3A (or pogo pins 57 of FIG. 3B) linking driver 24 to a connector (or pad) 16, represented in FIG. 4 as a circuit node. Since the output impedance of a tester driver is typically 50 Ohms, a coaxial cable 55 (or pogo pin 57) having a matching 50 Ohm characteristic impedance is used. FIG. 4 depicts cable 55 as a transmission line having a 50 Ohm characteristic impedance. Probe board assembly 58 provides signal paths linking node 16 to pads 34 on its lower surface. Spring contact probes 60 providing tips for contacting I/O pads 28 may be formed on pads 34. Alternatively spring contact probes 60 providing tips for contacting pads 34 may be formed on I/O pads 28. Probes 60 are suitably designed to act as 50 Ohm transmission lines and are modeled as such in FIG. 4.

As illustrated in FIG. 4, the signal path through probe board assembly 58 linking node 16 to pads 34 includes a via 37 having a 50 Ohm characteristic impedance extending vertically downward from node 16 to a near 50 Ohm lumped impedance transmission line 32 implemented by a conductive trace on a layer of PCB 58. One end of transmission line 32 is connected to node 16. U.S. patent application Ser. No. 09/761,352 filed Jan. 16, 2001 (incorporated herein by reference) discloses methods for tuning the frequency response of a via, which may be used in conjunction with the instant invention. A set of isolation resistors 36 link taps 38 of transmission line 32 to a set of 50 Ohm vias 39 extending downward through probe board assembly 58 to the pads 34 on its lower surface. Thus a test signal generated by driver 24 travels over cable 55 and via 37 to transmission line 32. Isolation resistors 36, vias 39 and probes 60 then distribute the test signal to corresponding I/O pads 28 of four ICs 50. FIG. 4 assumes that isolation resistors are embedded in probe board assembly 58 on the layer containing transmission line 32, but they may be mounted on the upper surface of the probe board assembly. In such case, additional 50 Ohm vias (not shown) are provided to link taps 38 to isolation resistors 36.

A defective IC may have a low impedance path from any I/O pad 28 to a ground, power or other conductor. When I/O pads 28 of several ICs were directly connected to one another, such a fault at any one I/O pad 28 would substantially affect the test signal voltage applied to all other pads 28 to which it is connected. Accordingly isolation resistors 36 are provided to isolate the I/O pads 28 of ICs 50 from one another so that a fault at an I/O pad 28 of a defective IC 50 will not substantially affect the voltage of the test signal arriving at I/O pads 28 of the other ICs 50 driven by the same test signal. Thus a fault at the I/O pad 28 of any defective IC 50 will not interfere with the tester's ability to test the other ICs.

The interconnect system of FIG. 4 is suitable for transmitting a low frequency test signal, however signal reflections occurring at each transmission line tap 38 can distort a high frequency test signal arriving at IC pads 28. These test signal reflections occur as a result of discontinuity in signal path impedances at taps 38. While the characteristic impedance of the transmission line 32 conveying the test signal into each tap 38 is 50 Ohms, the effective characteristic impedance of the signal paths conveying the test signal away from each tap 38 is the 40 Ohm parallel combination of the 50 Ohm transmission line 32 and a 50 Ohm isolation resistor 36. The reflection occurs because the 50 Ohm input impedance at each tap 38 does not match the 40 Ohm output impedance. These reflections are undesirable because they appear as distortions in the test signal as it arrives at IC I/O pads 28. The impedance mismatch at taps 38 can worsen when isolation resistors 36 do not reside on the same layer as transmission line 32 and vias are needed to link each tap 38 to an isolation resistor 36.

Since the magnitude of the reflection at each tap depends on the magnitude of the impedance mismatch, we reduce the reflection by increasing the size of isolation resistors 36, thereby decreasing the impedance mismatch. For example if resistors 36 were 400 Ohms each, then the output impedance of each tap 38 would be the parallel combination of 50 Ohms and 400 Ohms (about 44.5 Ohms) which would produce a smaller reflection at the tap. However increasing the size of isolation resistors 36 has a cost. In order to change the state of a test signal appearing at any IC I/O pad 28, it is necessary for the test signal to charge or discharge the capacitance 26 at the pad. By increasing the size of isolation resistors 36, we also increase the time the test signal needs to charge or discharge capacitance 26 at I/O pads 28 when it changes state. Since tester 10 has to wait longer between test signal state changes, it takes longer for it to test the ICs.

Figure 5:
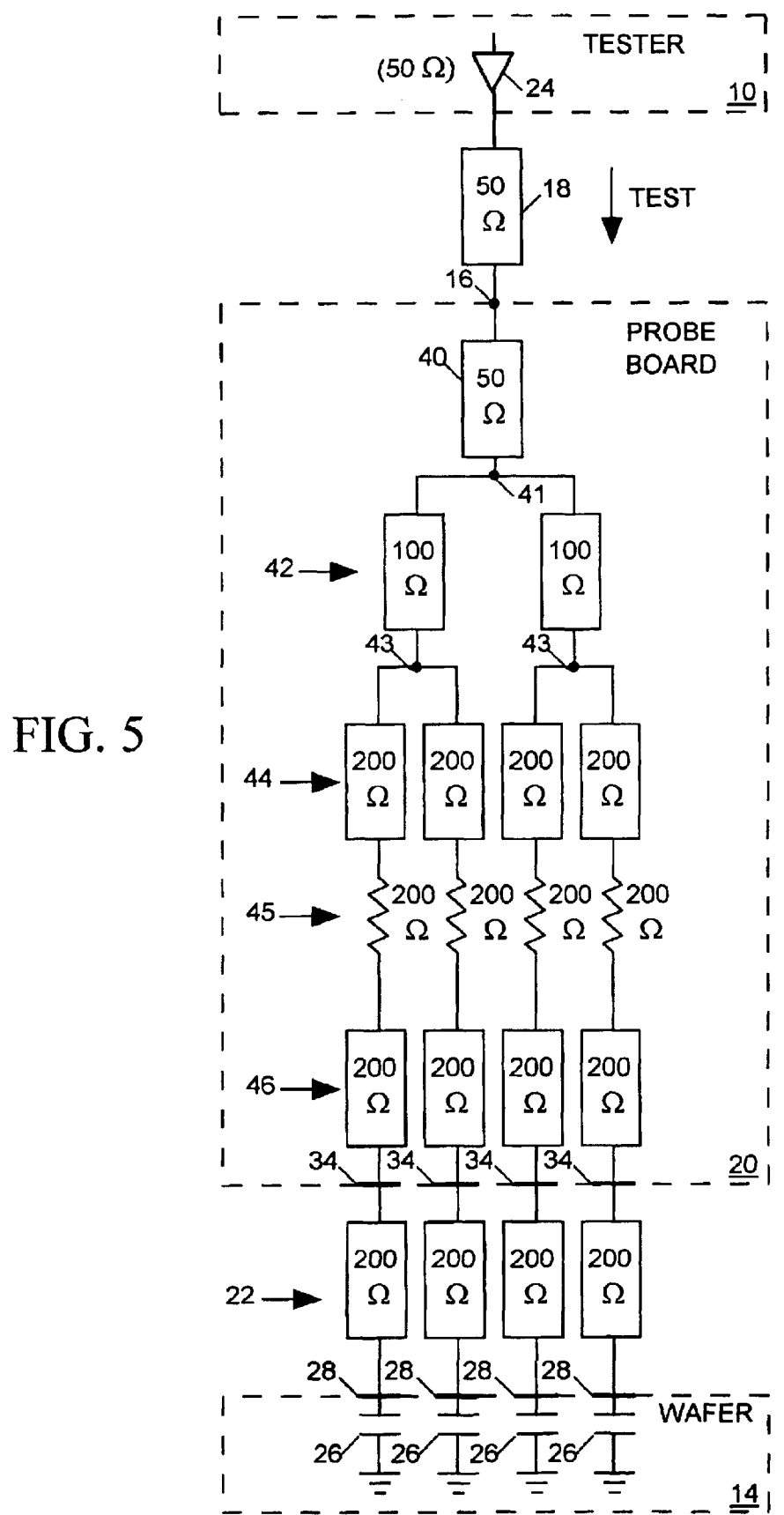

FIG. 5 illustrates another exemplary embodiment of the invention for distributing a test signal to several I/O pads 28, which reduces the reflection problem and minimizes differences in test signal voltages and edge timing at the I/O pads. The test signal from a driver 24 in tester 10 travels to connector node 16 on probe board assembly 58 through the 50 Ohm coaxial cable (or pogo pin) 55. The test signal then passes downward through a 50 Ohm via 40 to a node 41 residing on a layer of the probe board assembly containing two 100 Ohm transmission lines 42. The two transmission lines 42 convey the test signal from node 41 to two nodes 43, and four 50 Ohm transmission lines 44 convey the test signal from nodes 43 to a set of four 50 Ohm isolation resistors 45. 50 Ohm vias 46 route the test signal downward to pads 34 on the lower surface of probe board assembly 58, and four 50 Ohm spring contact probes 60 link pads 34 to the I/O pads 28 of four ICs on wafer 14.

No test signal reflection occurs at node 41 because the parallel combination of two 100 Ohm transmission lines 42 conveying the test signal away from node 41 matches the impedance of the 50 Ohm via 40 conveying the signal into node 41. Similarly no test signal reflections occur at nodes 43 because the parallel combination of 50 Ohm impedances of the transmission lines 44 carrying the test signal away from each node 43 matches the 100 Ohm impedance of the transmission line 42 delivering the test signal into each node 43. Since all components of the signals paths downstream of nodes 42 are 50 Ohms there are no test signal reflections at the junctions of those components. A test signal reflection does occur at each I/O contact 28, but since that reflection is downstream of an isolation resistor 45, it is largely absorbed by the isolation resistor and does not substantially distort the test signal on the upstream side of the isolation resistor. Therefore a test signal reflection at any one I/O pad 28 is severely attenuated before it reaches any other I/O pad 28.

The tree-like test signal distribution system illustrated in FIG. 5 has several advantages over the tapped distribution system of FIG. 4. While reflections in the distribution network of FIG. 4 can substantially distort the test signal arriving at each pad 28, reflections in the distribution network of FIG. 5 are substantially attenuated before they have a significant effect elsewhere in the network. While in the network of FIG. 4 a test signal edge arrives at each pad 28 at a different time, in the network of FIG. 5 each test signal edge can arrive at all pads 28 at substantially the same time when path lengths of the corresponding transmission lines are suitably matched. Also while the network of FIG. 4 delivers the test signal to each pad 28 with a different voltage, the network of FIG. 5 delivers the test signal with substantially the same voltage to all pads 28.

However the test signal distribution network of FIG. 5 requires probe board assembly 58 to provide transmission lines and vias having a variety of characteristic impedances ranging from 50 to 200 Ohms. The characteristic impedance of a trace formed on a substrate is a function of a number of factors including the width of the trace, distances to nearby ground or power conductors, and the dielectric constant of substrate separating the trace from nearby ground and power conductors. The characteristic impedance of a via is primarily a function of its physical dimensions, distances to nearby ground and power conductors and the dielectric constant of the PCB substrate surrounding it. The signal distribution architecture illustrated in FIG. 5 is therefore more difficult to design and expensive to fabricate a probe board assembly providing transmission lines having a variety of characteristic impedances than a probe board assembly in which all transmission lines have the same characteristic impedance. Also in the context of a probe board assembly wherein large numbers of transmission lines must be packed into a small volume it is less practical to provide transmission lines having characteristic impedances above 100–150 ohms because high impedance transmission lines take up too much space. Signal conductors forming higher impedance transmission lines must be more widely separated from ground and power conductors.

Figure 6:
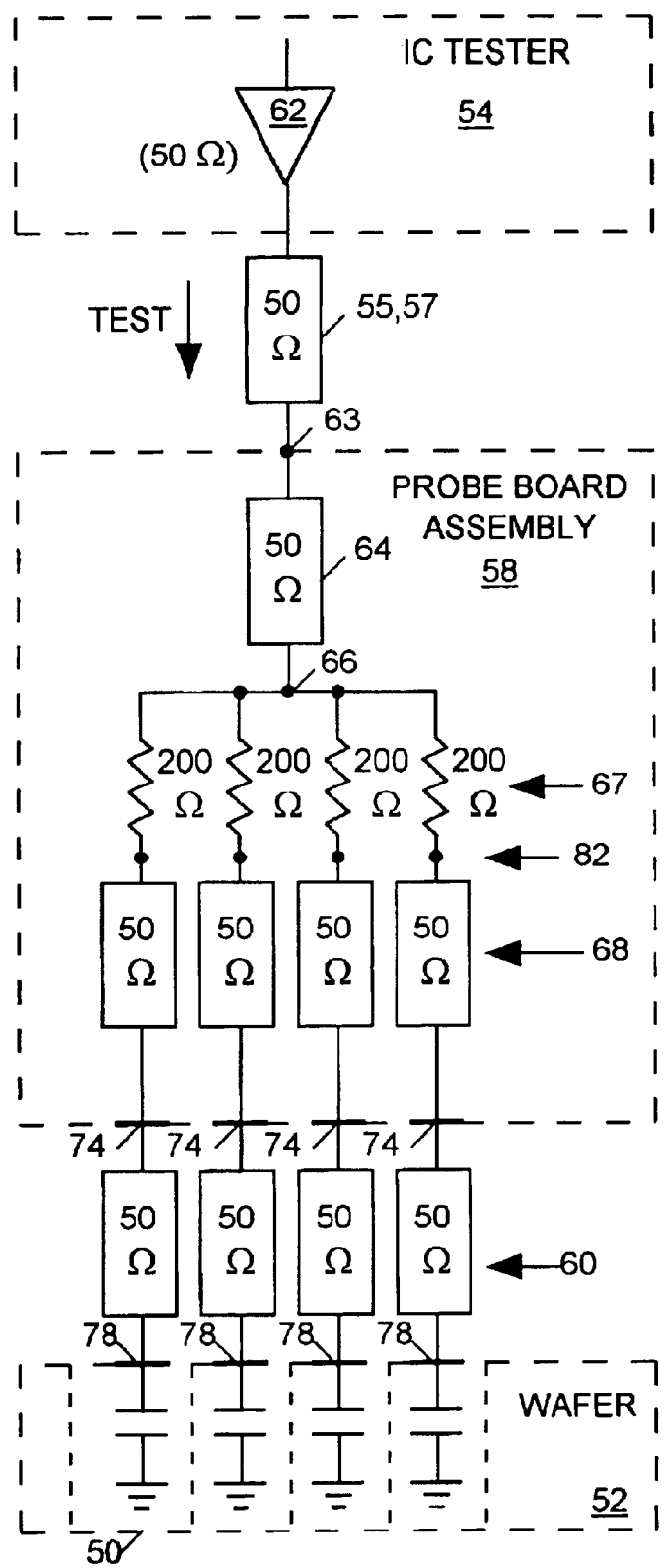

FIG. 6 is a schematic diagram illustrating an example of how probe board assembly 58 of FIG. 3A or 3B may implement a signal path in accordance with the invention for distributing a single test signal to I/O pads 78 of four ICs 50. The primarily capacitive input impedance (typically 2 picofarads) of each I/O pad 78 is represented in FIG. 4 by a capacitor 80.

Referring to FIGS. 3A, 3B and 6, a driver 62 within IC tester 54 transmits a test signal through a coaxial cable 55 or pogo pin 57 to an entry node 63 of probe board assembly 58. In this example, where driver 62 has a 50 Ohm output impedance, a 50 Ohm coaxial cable 55 or pogo pin 57 is employed to convey the signal between the driver and entry node 63. FIG. 4 therefore depicts coaxial cable 55 or pogo pin 57 as a 50 Ohm transmission line. A 50 Ohm transmission line 64 provided by probe board assembly 58 conveys the test signal to a "branch node" 66 at a junction between four 200 Ohm isolation resistors 67. Transmission line 64 is formed by horizontal traces residing on layers of probe board assembly 58 and vias passing vertically though layers of the probe board assembly. When the layers of the probe board assembly 58 include substrates that are vertically spaced from one another, transmission line 64 may also include spring contacts or other conductors extending between the spaced layers.

Each isolation resistor 67 links branch node 66 to one end of a separate one of a set of 50 Ohm transmission lines 68, each of which conveys the TEST signal to a separate pad 74 formed on the lower side of probe board assembly 58. Each transmission line 68 may include horizontal traces residing on layers of probe board assembly 58, vias passing vertically though layers of the probe board assembly and from one another, transmission line 64 may also include spring contacts or other conductors extending between the layers when the layers are spaced apart. A set of 50 Ohm probes 60 provide signal paths between the pads 74 and the IC I/O pads 78.

Isolation resistors 67 isolate the I/O pads 78 of ICs 50 from one another so that a fault such as a low impedance path to ground, power or another signal conductor at any I/O pad 78 of a defective IC 50 will not substantially affect the test signal voltage applied to other I/O pads 78 driven by the same test signal. Thus a fault at the I/O pad 78 of any one defective IC 50 will not interfere with the tester's ability to test other ICs.

The four isolation resistors 67 are mounted on a layer of probe board assembly 58 with their ends close to branch node 66 so that the branch node acts as a single junction between the 50 Ohm transmission line 65 and the four 200 Ohm resistors 67. Thus a test signal entering branch node 66 through the 50 Ohm transmission line 65 encounters a parallel combination of four 200 Ohm resistors 67, which is the equivalent of 50 Ohms. There may be some signal reflection from node 78 back toward node 82, however the effect of any such reflection may be minimized by keeping the transit time between nodes 82 and 78 relatively short as compared to the rise time of the signal. Such reflections may be reduced or eliminated by terminating node 78 with a 50 ohm resistor. In such a case, the drive level voltage from the tester driver 62 may be increased to compensate for a voltage drop across the 50 ohm resistor.

The test signal distribution network illustrated in FIG. 4 does, however, include eight points at which a mismatch in input and output impedance do lead to test signal reflections. There is an impedance mismatch at each of the four nodes 82 at the junction between each 200 Ohm isolation resistor 67 and one of 50 Ohm transmission lines 68. There is also an impedance mismatch at each of the four IC I/O pads 78 where a 50 Ohm probe 60 meets the 2 picofarad input capacitance 80 of the pad. But note that each impedance mismatch point 78 or 82 at which a reflection occurs is downstream of one of the 200 Ohm isolation resistors 67. Each isolation resistor 67 greatly attenuates the reflections occurring downstream so that they have very little effect on the test signal upstream of the isolation resistor. Thus a test signal reflection occurring in any branch of the network leading to any one I/O IC pad 78 has little distorting effect on the test signal passing though a branch of the network leading to any other IC I/o pad 78.

Comparing the test signal distribution networks of FIGS. 4 and 5 to the distribution network of FIG. 6, note that the networks of FIGS. 5 and 6 both substantially reduce test signal distortion due to reflections over that occur in the network of FIG. 2. Note also that unlike the test signal distribution network of FIG. 4, it is possible to balance the networks of FIGS. 5 and 6 so that each test signal edge will arrive at all I/O pads 78 at substantially the same time and with substantially the same amount of attenuation.

Unlike the test signal distribution networks of FIG. 5, the network of FIG. 6 permits all traces 65 and 68 and all vias 64 and 69 to have the same characteristic impedance. This makes a probe board assembly 58 implementing the network of FIG. 6 easier to design and less costly to manufacture than a probe board assembly 20 implementing the network of FIG. 5, which would have to provide transmission lines having a variety of characteristic impedances.

Thus the branching signal path of FIG. 6 provides resistors at the branch points of a branching network within a probe board assembly to deliver a test signal to several ICs. It should be understood that many variations to the topology of a branching network of FIG. 6 are possible. For example given an 50 Ohm transmission line conveying a test signal to a branch point, a set of six 300 Ohm isolation resistors linked to the branch point could distribute the test signal to six ICs, or a set of eight 400 Ohm isolation resistors at the branch point could distribute the signal to eight ICs. The transmission lines 55, 57, 64, 69 and probes 60 may be other than 50 Ohms. For example when all transition lines and probes are 75 Ohms, resistors 67 may be 300 Ohms. It is not necessary that all transmission lines and probes have the same characteristic impedance. For example while transmission line 55, 57 and 64 should have a matching impedance of for example 50 Ohms, transmission lines 68 and probes 60 may have, for example, a 100 Ohm impedance that does not match that of transmission lines 55, 57 and 64.

Figure 7:
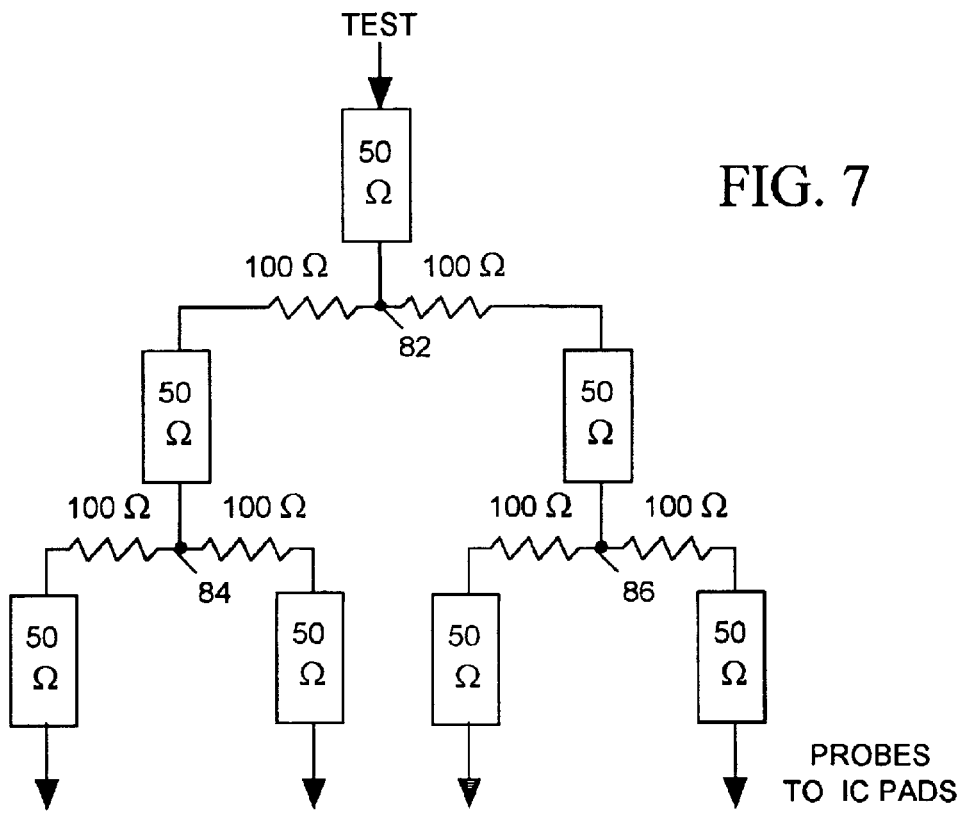

A signal path through probe board assembly 58 of FIG. 3A or 3B may include more than one branch point. For example FIG. 7 illustrates an exemplary embodiment of the invention, a network having three branch points 82, 84 and 86, wherein at each branch point a 50 Ohm transmission line branches into two 100 Ohm isolation resistors and. 50 Ohm transmission lines convey the test signal to the IC pads. Note that each impedance discontinuity in which a 100 Ohm resistor meets a single 50 Ohm transmission line occurs downstream of a 100 Ohm resistor which can substantially dissipate the energy of reflections occurring at the discontinuity.

Figure 8:
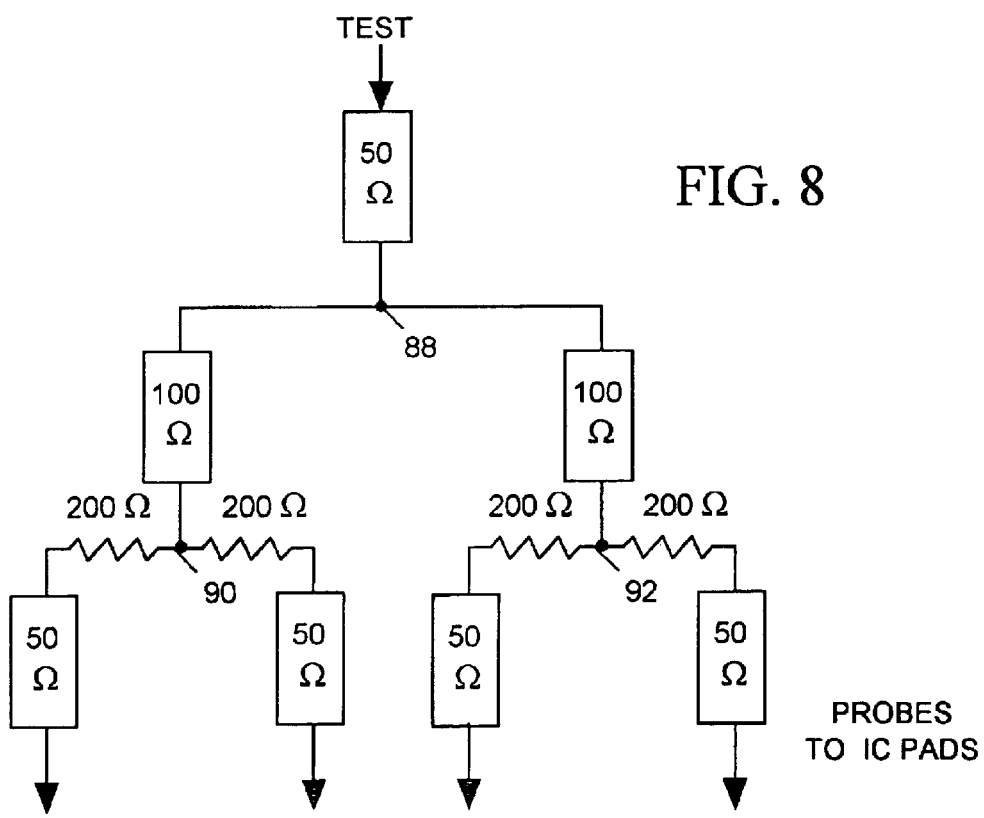

FIG. 8 illustrates a branching path within a probe board assembly implemented in accordance with another exemplary embodiment of the invention wherein a 50 Ohm transmission line branches into two 100 Ohm transmission lines at a branch point 88. Each of the two 100 Ohm transmission lines then branches into two 200 Ohm resistors at branch points 90 and 92. 50 Ohm transmission lines convey the test signals from the 200 Ohm resistors to the IC pads. This embodiment of the invention requires the probe board assembly to implement both 50 Ohm and 100 Ohm transmission lines. However while transmission lines having characteristic impedances much larger than about 150 Ohms are difficult to implement on PCBs, it 50 and 100 Ohm transmission lines can be easily implemented.

FIG. 9 illustrates another exemplary embodiment of the invention, a multiple-layer probe card assembly 120 for providing signal paths between an integrated circuit tester 122 and pads 123 on surfaces of IC dice 124 on a wafer 126 under test. Probe card assembly 120 includes a probe board 130 having a set of pads 132 on its upper surface for receiving tips of a set of pogo pin connectors 134 providing signal paths between tester 122 and pads 132. An interposer layer 135 having a set of spring contacts 136 and 138 connected to its upper and lower surfaces provides signal paths between a set of contacts 140 on the lower surface of probe board 130 and a set of contacts 142 on an upper surface of a space transformer board 144. A set of probes 146 provide signal paths between pads 148 on the lower surface of space transformer 144 and IC pads 123. Probe board 130, interposer 138 and space transformer 144 may include single or multiple insulating substrates with traces formed on the substrates and vias extending through the substrate for conducting signals horizontally and vertically between pads and/or contacts on their upper and lower surfaces. In other embodiments of the invention, cables may be used to link tester 122 to probe board 130 in lieu of pogo pins 136.

In accordance with this exemplary embodiment of the invention, some of the signal paths though probe board assembly 120 branch so that a channel of IC tester 122 employing a single one of pogo pins 134 as an output terminal can concurrently drive more than one IC pad 123. Isolation resistors (not shown in FIG. 15) formed on or within one or more of layers 130, 135 and 144 are included in the branching paths between pogo pins 134 and IC pads 123.

Figures 10, 11, 12, 13:
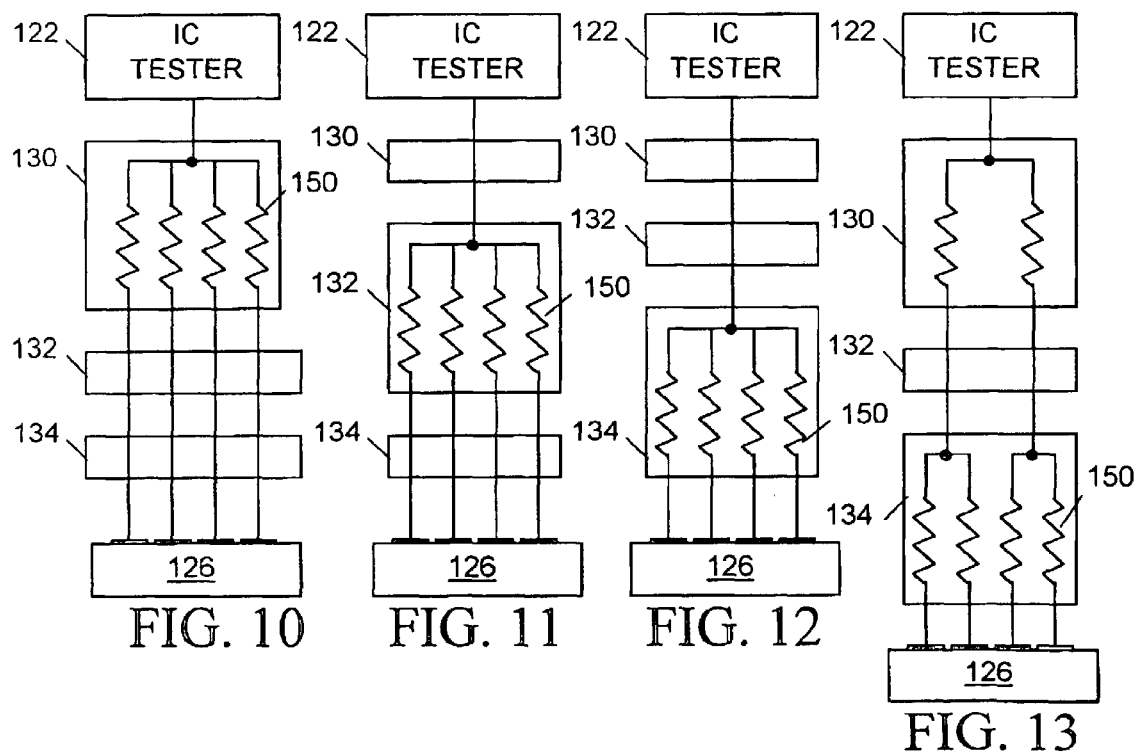

FIGS. 10–13 are schematic diagrams illustrating various exemplary embodiments of a branching signal path within probe board assembly 120 in accordance with the invention. In FIG. 10 the isolation resistors 150 are formed on or between layers of probe board 130. In the examples of FIGS. 11 and 12, the isolation resistors 150 are formed on or between layers of interposer 135 and space transformer 134, respectively. A hierarchical resistor network (such as illustrated in FIGS. 5–7) may also be implemented by mounting resistors on one or more boards of probe board assembly 120. For example, FIG. 19 illustrates a signal path including such a hierarchy including isolation resistors 150 formed on probe board 130 and on space transformer 134.

While exemplary embodiments of an interconnect systems in accordance with the invention described herein above provide a branching signal paths between an IC tester and I/O pads of one or more ICs 50 that have not yet been separated from the semiconductor wafer 52 on which they are formed, similar branching signal paths can be provided in interconnect systems that linking IC testers to ICs after they have been separated from one another. For example, arrays of separated, unpackaged ICs held in trays can be concurrently accessed by the same IC tester using interconnect systems generally similar to that described above. When the ICs are packaged, the probes may be adapted access package pins or other types of IC package terminals I/O pads on the surface of the ICs.

The forgoing specification and the drawings depict the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps depicted in the specification and drawings.

What is claimed is:

1. An apparatus for providing signal paths between an integrated circuit (IC) tester and a plurality of IC terminals so that a driver within the IC tester can concurrently transmit a test signal to the IC terminals, said test signal exhibiting high and low voltage levels representing logic states, wherein a fault at any one of the IC terminals conductively linking that IC terminal to a source of potential can drive that IC terminal near either of said high and low voltage levels, the apparatus comprising:

a first signal path having a first characteristic impedance for conveying the test signal away from the driver;

a plurality of probes, each for conveying the test signal to a separate one of the plurality of IC terminals; and a network comprising resistors for conveying the test signal from the first signal path to each of the probes, wherein the resistors isolate the IC terminals from one another by an amount of resistance that is substantially larger than the first characteristic impedance of the first signal path and sufficiently large to prevent the fault at any one of the IC terminals from affecting a logic state represented by the test signal at any other of the IC terminals.

2. The apparatus in accordance with claim 1 wherein the first signal path and the probes have substantially similar characteristic impedances.

3. The apparatus in accordance with claim 1 wherein the network comprises:

a second signal path having a set of taps, the first signal path delivering the test signal to the second signal path, the second signal path conveying the test signal to its taps;

a plurality of first resistors, each having a first terminal connected to a separate one of said taps for receiving the test signal, and having a second terminal, each first resistor conveying the test signal from its first terminal to its second terminal; and a plurality of third signal paths, each conveying the test signal from a separate one of the second terminals to a separate one of the probes.

4. The apparatus in accordance with claim 3 wherein the second signal path has a uniform second characteristic impedance between its taps substantially matching the first characteristic impedance of the first signal path.

5. The apparatus in accordance with claim 1 wherein the network comprises:

a first node (41), the first signal path delivering the test signal to the first node;

a plurality of second nodes (43);

a plurality of second signal paths (42), each connected for conveying the test signal from the first node to a separate one of the second nodes, and each second signal path having a second characteristic impedance;

a plurality of first resistors;

a plurality of sets of third signal paths (44), each set corresponding to a separate one of the second nodes, each third signal path of each set being connected for conveying the test signal from the set's corresponding second node to a separate one of the first resistors, and each third signal path having a third characteristic impedance.

6. The apparatus in accordance with claim 5 wherein the second characteristic impedances of the second signal paths are sized relative to the first characteristic impedance of the first signal path so as to substantially minimize test signal reflections at the first node.

7. The apparatus in accordance with claim 6 wherein the third characteristic impedances of the third signal paths are sized relative to the second characteristic impedance of the second signal path so as to substantially minimize test signal reflections at the second nodes.

8. The apparatus in accordance with claim 1 wherein the network comprises:

a first node (66), the first signal path delivering the test signal to the first node;

a plurality of first resistors (67), each having a first terminal and a second terminal, the first terminals of all first resistors being connected to the first node such that each resistor conveys the test signal from the first node to its second terminal, and a plurality of second signal paths (68), each linking the second terminal of a separate one of the first resistors to a separate one of the probes.

9. The apparatus in accordance with claim 8 wherein the first resistors are of resistances sized relative to the first characteristic impedance of the first signal path so as to substantially minimize test signal reflections at said first node.

10. The apparatus in accordance with claim 1 wherein the network comprises:

a first node (82), the first signal path delivering the test signal to the first node;

a plurality of first resistors, each having a first terminal and a second terminal, the first terminals of all first resistors being connected to the first node such that each first resistor conveys the test signal from the first node to its second terminal, a plurality of second nodes (84, 86);

a plurality of second signal paths, each having a second characteristic impedance and being linked for conveying the test signal from the first node to a separate one of the second nodes;

a plurality of sets of second resistors, each set corresponding to a separate one of the second nodes, each second resistor having a third terminal and a fourth terminal, the third terminals of the second resistors of each set being connected to the set's corresponding second node; and a plurality of third signal paths, each third signal path being connected for conveying the test signal from the second terminal of a separate one of the first resistors to a separate one of the probes.

11. The apparatus in accordance with claim 10 wherein the first resistors are of resistances sized relative to the first characteristic impedance of the first signal path so as to substantially minimize test signal reflections at the first node.

12. The apparatus in accordance with claim 11 wherein the second resistors are of resistances sized relative to the second characteristic impedances of the second signal paths so as to substantially minimize test signal reflections at the second nodes.

13. The apparatus in accordance with claim 11 wherein the first, second and third signal paths all have substantially similar impedances.

14. The apparatus in accordance with claim 1 wherein the network comprises:
   a first node (88), the first signal path delivering the test signal to the first node;
   a plurality of second nodes (90, 92);
   a plurality of second signal paths (42), each having a second characteristic impedance being connected for conveying the test signal from the first node to a separate one of the second nodes;
   plurality of sets of first resistors, each set corresponding to a separate one of the second nodes, each first resistor having a first terminal and a second terminal, the first terminals of all first resistors of each set being to a corresponding one of the second nodes; and
   a plurality of third transmission lines, each for conveying the test signal from the second terminal of a separate one of the first resistors to a separate one of the probes.

15. The apparatus in accordance with claim 14 wherein the second characteristic impedances of the second signal paths are sized relative to the first impedance of the first signal path to substantially minimize test signal reflections at the first node.

16. The apparatus in accordance with claim 15 wherein a resistance of each first resistor is sized to substantially minimize test signal reflections the second nodes.

17. The apparatus in accordance with claim 1 wherein said first characteristic impedance is less than 150 Ohms.

18. The apparatus in accordance with claim 1 wherein said first characteristic impedance is in a range of 50 to 150 Ohms.

19. An apparatus for providing signal paths between an integrated circuit (IC) tester and a plurality of IC terminals so that a driver within the IC tester can concurrently transmit a test signal to the IC terminals, said test signal exhibiting high and low voltage levels representing logic states, wherein a fault at any one of the IC terminals conductively linking that IC terminal to a source of potential can drive that IC terminal near either of said high and low voltage levels, the apparatus comprising:
   a first signal path having a first characteristic impedance for conveying the test signal away from the driver;
   a plurality of probes, each for conveying the test signal to a separate one of the plurality of IC terminals; and
   a probe board assembly comprising:
      at least one substrate; and
      a network comprising resistors supported by the at least one substrate, for conveying the test signal from the first signal path to each of the probes,
      wherein the resistors isolate the IC terminals from one another by an amount of resistance that is substantially larger than the first characteristic impedance of the first signal path and sufficiently large to prevent the fault at any one of the IC terminals from affecting a logic state represented by the test signal at any other of the IC terminals.

20. The apparatus in accordance with claim 19 wherein the probes are attached to the probe board assembly and include tips for contacting the IC terminals.

21. The apparatus in accordance with claim 19 wherein the probes are attached to the IC terminals and include tips for contacting the probe board assembly.

22. The apparatus in accordance with claim 19 wherein the network comprises:
   a second signal path having a set of taps, the first signal path delivering the test signal to the second signal path, the second signal path conveying the test signal to its taps, wherein the second signal path has a uniform second characteristic impedance between its taps substantially matching the first characteristic impedance of the first signal path;
   a plurality of first resistors, each having a first terminal connected to a separate one of said taps for receiving the test signal, and having a second terminal, each first resistor conveying the test signal from its first terminal to its second terminal; and
   a plurality of third signal paths, each conveying the test signal from a separate one of the taps to a separate one of the probes.

23. The apparatus in accordance with claim 19 wherein the network comprises:
   a first node (41), the first signal path delivering the test signal to the first node;
   a plurality of second nodes (43);
   a plurality of second signal paths (42), each connected for conveying the test signal from the first node to a separate one of the second nodes, and each second signal path having a second characteristic impedance sized relative to the first characteristic impedance of the first signal path so as to substantially minimize test signal reflections at the first node;
   a plurality of first resistors;
   a plurality of sets of third signal paths (44), each set corresponding to a separate one of the second nodes, each third signal path of each set being connected for conveying the test signal from the set's corresponding second node to a separate one of the first resistors, and each third signal path having a third characteristic impedance sized relative to the second characteristic impedance of the second signal path so as to substantially minimize test signal reflections at the second nodes.

24. The apparatus in accordance with claim 19 wherein the network comprises:
   a first node (66), the first signal path delivering the test signal to the first node;
   a plurality of first resistors (67), each having a first terminal and a second terminal, the first terminals of all first resistors being connected to the first node such that each resistor conveys the test signal from the first node to its second terminal, wherein the first resistors are of resistances sized relative to the first characteristic impedance of the first signal path so as to substantially minimize test signal reflections at said first node, and
   a plurality of second signal paths (68), each linking the second terminal of a separate one of the first resistors to a separate one of the probes.

25. The apparatus in accordance with claim 19 wherein the network comprises:
- a first node (82), the first signal path delivering the test signal to the first node;
- a plurality of first resistors, each having a first terminal and a second terminal, the first terminals of all first resistors being connected to the first node such that each first resistor conveys the test signal from the first node to its second terminal,
- a plurality of second nodes (84, 86);
- a plurality of second signal paths, each having a second characteristic impedance and being linked for conveying the test signal from the first node to a separate one of the second nodes;
- a plurality of sets of second resistors, each set corresponding to a separate one of the second nodes, each second resistor having a third terminal and a fourth terminal, the third terminals of the second resistors of each set being connected to the set's corresponding second node; and
- a plurality of third signal paths, each third signal path being connected for conveying the test signal from the second terminal of a separate one of the first resistors to a separate one of the probes,
- wherein the first resistors are of resistances sized relative to the first characteristic impedance of the first signal path so as to substantially minimize test signal reflections at the first node, and
- wherein the second resistors are of resistances sized relative to the second characteristic impedances of the second signal paths so as to substantially minimize test signal reflections at the second nodes.

26. The apparatus in accordance with claim 19 wherein the network comprises:
- a first node (88), the first signal path delivering the test signal to the first node;
- a plurality of second nodes (90, 92);
- a plurality of second signal paths (42), each being connected for conveying the test signal from the first node to a separate one of the second nodes, and each having a second characteristic impedances sized relative to the first impedance of the first signal path to substantially minimize test signal reflections at the first node,
- a plurality of sets of first resistors, each set corresponding to a separate one of the second nodes, each first resistor having a first terminal and a second terminal, the first terminals of all first resistors of each set being to a corresponding one of the second nodes, wherein a resistance of each first resistor is sized to substantially minimize test signal reflections the second nodes; and
- a plurality of third transmission lines, each for conveying the test signal from the second terminal of a separate one of the first resistors to a separate one of the probes.

27. The apparatus in accordance with claim 19 wherein said first characteristic impedance is less than 150 Ohms.

28. The apparatus in accordance with claim 19 wherein said first characteristic impedance is in a range of 50 to 150 Ohms.

29. The apparatus in accordance with claim 19,
- wherein said probe board assembly comprises a printed circuit board having a plurality of layers,
- wherein said network comprises said resistors and traces formed on at least one layer of the printed circuit board and vias passing though the layers of the printed circuit board, and
- wherein all said traces and vias forming the network have substantially similar characteristic impedances.

30. The apparatus in accordance with claim 19
- wherein said probe board assembly comprises a plurality of substrates spaced apart from one another, and
- wherein the network comprises conductors extending between and conveying the test signal through of the substrates.

31. The apparatus in accordance with claim 30 wherein the resistors are mounted on only one of the substrates.

32. The apparatus in accordance with claim 30 wherein the resistors are mounted on more than one of the substrates.

* * * * *